(12) United States Patent
Buijze et al.

(10) Patent No.: US 6,225,602 B1
(45) Date of Patent: May 1, 2001

(54) VERTICAL FURNACE FOR THE TREATMENT OF SEMICONDUCTOR SUBSTRATES

(75) Inventors: Jacobus Pieter Buijze, Hilversum; Jeroen Jan Stoutjesdijk, Utrecht; Christianus Gerardus Maria De Ridder, Hoogland; Hubertus Johannes Julius Stohr, 's-Hertogenbosch, all of (NL)

(73) Assignee: Advanced Semiconductor Materials International N.V., Bilthoven (NL)

( * ) Notice: Subject to any disclaimer, the term of this patent is extended or adjusted under 35 U.S.C. 154(b) by 0 days.

(21) Appl. No.: 09/214,446

(22) PCT Filed: May 5, 1998

(86) PCT No.: PCT/NL98/00246

§ 371 Date: Dec. 29, 1998

§ 102(e) Date: Dec. 29, 1998

(87) PCT Pub. No.: WO98/50606

PCT Pub. Date: Nov. 12, 1998

(30) Foreign Application Priority Data

May 2, 1997 (NL) .................................................. 1005963

(51) Int. Cl.$^7$ ...................................................... F27B 5/14
(52) U.S. Cl. .................. 219/390; 392/416; 118/50.1; 373/136
(58) Field of Search .................................... 219/390, 405, 219/411; 392/416, 418; 118/50.1, 724, 725; 373/136; 427/553, 557, 559; 432/77, 83, 152; 438/795

(56) References Cited

U.S. PATENT DOCUMENTS

| | | |
|---|---|---|
| 4,179,530 | 12/1979 | Koppl et al. . |
| 4,738,618 | 4/1988 | Massey et al. . |
| 5,308,955 | * 5/1994 | Watanabe ............................. 219/390 |
| 5,312,245 | 5/1994 | Brannen et al. . |
| 5,482,559 | * 1/1996 | Imai et al. ........................... 118/728 |
| 5,662,470 | * 9/1997 | Huussen et al. ..................... 432/241 |

FOREIGN PATENT DOCUMENTS

| | | |
|---|---|---|
| 89 02 307 U | 8/1989 | (DE) . |
| 2 184 885 | 7/1987 | (GB) . |
| 2184885 | * 7/1987 | (GB) . |
| 59-189633 | * 10/1984 | (JP) . |
| 3-194933 | * 8/1991 | (JP) . |

OTHER PUBLICATIONS

Patent Abstract of Japan: vol. 9, No. 49 (E–300); Mar. 2, 1985 & JP 59 189622 A (Toshiba Ceramics KK); Oct. 27, 1984.

Patent Abstract of Japan; vol. 15, No. 454 (E–1135); Nov. 19, 1991 & JP 03 194933 A (Tokyo Electron Sagami Ltd); Aug. 26, 1991.

\* cited by examiner

Primary Examiner—Teresa Walberg
Assistant Examiner—Shawntina T. Fuqua
(74) Attorney, Agent, or Firm—Knobbe, Martens, Olson & Bear, LLP

(57) ABSTRACT

The treatment chamber in the furnace is delimited by a liner of refractory material. In order to increase the life thereof and in particular to restrict the sensitivity to deposits deposited by the process gas fed through the furnace, it is proposed to make the liner of a silicon carbide material. To seal the furnace chamber, a second liner of quartz material is placed around a liner of this type and the gap between the two liners is flushed.

12 Claims, 1 Drawing Sheet

VERTICAL FURNACE FOR THE TREATMENT OF SEMICONDUCTOR SUBSTRATES

BACKGROUND OF THE INVENTION

The present invention relates to a vertical furnace for the treatment of semiconductor substrates under reduced pressure, comprising a treatment chamber delimited by a first liner made of refractory material, around which a second liner made of quartz material is arranged essentially concentrically, and wherein a heating element is arranged outside the second liner, which heating element is enclosed by refractory materials.

A furnace of this type is disclosed in U.S. Pat. No. 4,738,618. Said patent describes a furnace having two spaced liners, the inner liner being closed off at the top and arranged such that it is movable in the vertical direction.

Processing at reduced pressure is deemed to be a treatment at a pressure of less than 2 Torr, more particular 1 Torr, and more specificly in the range between 100 and 150 milli Torr.

As a result it is not possible to feed a process gas in the vertical direction, as is required for certain treatments of semiconductor substrates, through a furnace of this type.

U.S. Pat. No. 5,312,245 describes a furnace with which such a treatment is possible. The furnace has an inner and an outer liner, the liner which delimits the treatment chamber being made of quartz material.

In the prior art two materials are used for furnaces which operate at high temperature and in which semiconductor substrates are treated. In by far the majority of cases, quartz material is used because this provides a good seal of the treatment chamber with respect to the environment and can relatively simply be provided with appendages, such as nozzles and other components. Furthermore, a quartz liner of this type is relatively inexpensive to produce.

The disadvantage of a quartz liner, however, is that, during the process, material which inevitably deposits from the process gas gives rise to appreciable stresses in the quartz liner. Such deposits are particularly difficult to remove and lead, after a limited number of treatments, to the need for replacement of the quartz tube. With average continuous operation of such a furnace it is necessary to clean the quartz tube after approximately two weeks and after cleaning two to three times a quartz tube of this type is no longer usable.

Another material used in the prior art for other applications is silicon carbide. This is not used in vacuum furnaces because it is porous, with the result that it is not possible to provide a seal with respect to the environment, so that it is no longer possible to guarantee that, under the critical conditions of elevated temperature and low pressure, only process gases move through the furnace. Furthermore, it is difficult to make vacuum seals on the basis of O-rings because of the good thermal conductivity of silicon carbide. Silicon carbide is a particularly expensive material when it is shaped into diverse forms, such as fitting nozzles, flanges and the like on liners.

SUMMARY OF THE INVENTION

The aim of the present invention is to provide a vertical furnace which can be cleaned more simply and with which the operating period between two maintenance periods can be appreciably lengthened, that is to say with which the liner concerned has a longer life.

This aim is achieved with a vertical furnace as described above having a SiC liner. The SiC liner and the second liner each have a nozzle at the top, wherein the nozzle of the second liner is arranged concentrically around the nozzle of the SiC liner. A free end of at least one nozzle is connected to the remainder of the furnace via a sealing which permits movement, wherein a gap between the liners can be put under reduced pressure and wherein a second liner is sealed relative to the surroundings.

It has been found that silicon carbide forms a surface providing good adhesion for materials which deposit from the process gases. Moreover, it has been found that the coefficient of expansion of silicon carbide and the deposited materials have a relationship relative to one another such that good adhesion is obtained. This is in contrast to quartz, where an appreciable difference in coefficient of expansion exists, which leads in the case of greater layer thicknesses to failure of the tube occurring under stresses generated by temperature. Failure of this type has not been detected in the case of a silicon carbide tube. Problems associated with the porosity of silicon carbide are solved according to the invention in that a quartz tube is positioned around a silicon carbide tube of this type. That is to say, the treatment chamber is sealed with respect to the environment. It has been found that the porosity of the silicon carbide is so low that a negligible quantity of process gas enters the gap between the two tubes. Moreover, this ingress of process gases can be further prevented if the gap between the two liners is flushed with an inert flushing gas which displaces the process gas or leads to a lower partial pressure of the process gas.

With this construction it is no longer necessary regularly to carry out maintenance on the liner, that is to say regularly to remove deposits from the liner and/or to replace the liner. As a result, the somewhat higher costs associated with the production of the boundary of the treatment chamber from a silicon carbide material are fully justified.

From the abstract of the Japanese patent application 59 189 622 a method is known for coating of a silicon carbide tube. This tube is provided with a coating inside a furnace having a furnace liner of quartz material. Around the silicon carbide tube to be processed a graphite liner is provided. The tube to be processed is loosely provided in the furnace and is not part of the furnace as is the liner according to the invention.

From the abstract of the Japanese patent application 03 194933 a furnace operating at atmospheric pressure is known having a double liner between which a gas is passed. A second liner comprises silicon carbide. If such furnace would to be operated under vacuum conditions, it would be possible to seal the second liner relative to the surroundings, which is not possible in view of the good thermal conductivity of silicon carbide with rubber seals or other material in practice.

The first liner according to the invention comprising silicon carbide material has to be provided with a feed for process gas at the top. As indicated, it is not simple to produce a spout with tight concentric tolerance on a silicon carbide tube, and it is therefore proposed, according to one embodiment of the invention, to fit an attachment on the top of the silicon carbide liner, which attachment is tubular and provides a link to the connection for a process gas. Because such an attachment is subjected to very much lower stresses and completely different conditions prevail therein, it is also possible to produce said attachment from relatively inexpensive quartz material. During operation, any small openings between the attachment and the liner made of silicon carbide material will be sealed immediately by deposits from the process gas. Such gaps will be present the first time such a furnace is started up because of the different coefficients of expansion and mechanical tolerances. However, deposits will settle from the process gas flowing through said gaps. A connection of this type will be broken again when a furnace cools. This will take place in the colder section where there is no or hardly any deposit growth. The coupling between the tubular attachment and the silicon carbide liner can be of any shape known from the prior art. However, preference is given to constructing this coupling in a ball-and-dish shape.

Preferably, the spout of the liner made of quartz material is fitted around a coupling tube of this type. This spout can be in one piece with the quartz liner, as is generally known in the prior art. A flushing gas can be introduced into the gaps between the two tubes, which gas is then distributed in the gaps between the two liners.

It is necessary to fit sealing means, in the vicinity of the top of the nozzles, which permit some movement relative to the environment on heating and cooling of the furnace. A seal generally known in the art is a vacuum-tight stuffing box seal and this is found to suffice particularly well.

With a construction as described above it is not easily possible to fit a thermocouple from the top, as is generally known in the prior art. Moreover, it is necessary to avoid the thermocouple having fixing points with the temporary treatment section of the furnace because this once again can give rise to stresses and deposits.

According to a further alternative embodiment of the invention, it is therefore proposed to fit and to fix the thermocouple in the furnace from below and to provide a fixing in the furnace chamber only where actual treatment does not take place, that is to say at the bottom where no or hardly any growth of deposit takes place because the requisite reaction temperature does not exist. It must, however, be understood that such a thermocouple can also be used in any other furnace.

The invention also relates to a method for treating a semiconductor substrate in a vertical furnace comprising a double-walled liner, where a process gas is introduced into the treatment chamber delimited by the first liner and a flushing gas is introduced into the gap between the first and the second liner, the furnace being provided with a discharge, which is under reduced pressure, for these gases. According to an advantageous embodiment of this method, the quantity of flushing gas metered in is at least 50 times less than the quantity of treatment gas metered in, so that it is not necessary substantially to increase the capacity of the vacuum pump which is connected downstream of the furnace.

BRIEF DESCRIPTION OF THE DRAWINGS

The invention will be explained in more detail below with reference to illustrative embodiments shown in the drawing. In the drawing.

DETAILED DESCRIPTION

Figure 1:
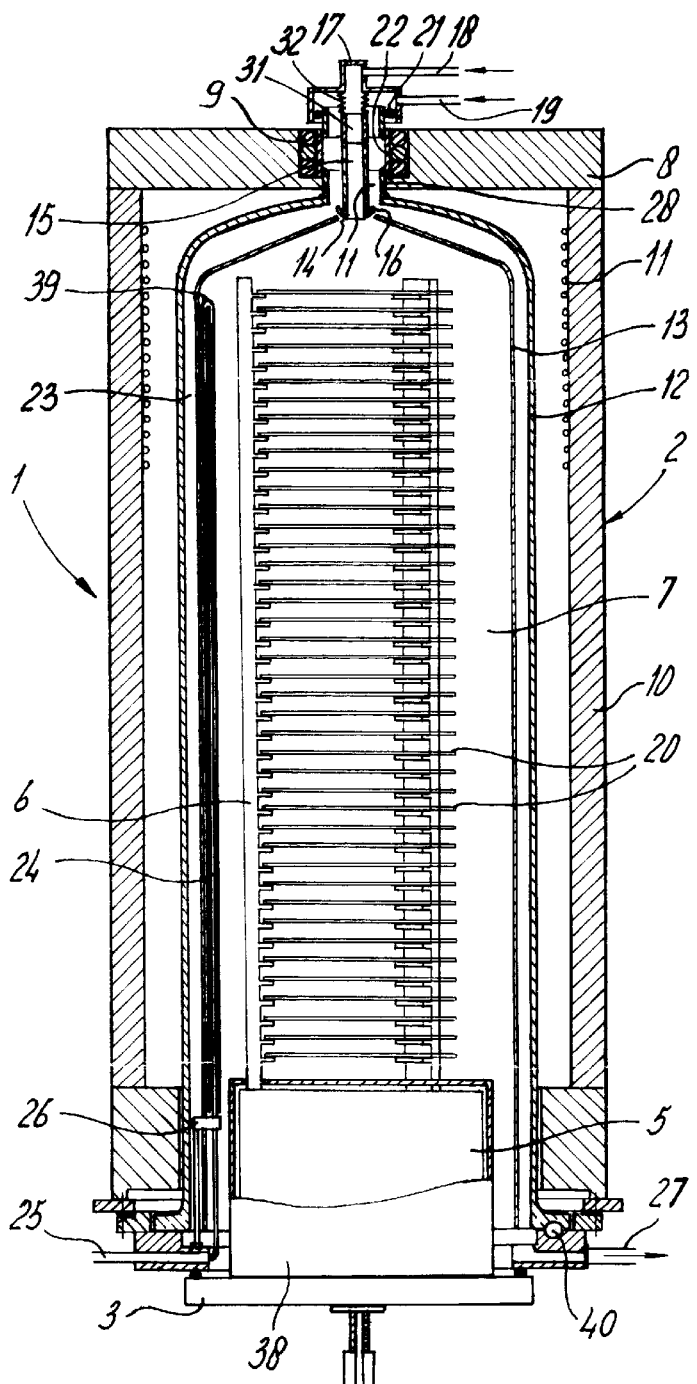
FIG. 1 shows, diagrammatically in cross-section, a first embodiment of the furnace according to the invention.

In FIG. 1 a vertical furnace according to the invention is shown by 1. The furnace consists of a stationary or fixed section 2 which can be closed off at the bottom with the aid of a cover 3. The cover is provided with an insulating plug 5 fitted thereon, on which insulating plug a wafer rack 6, which is preferably made of silicon carbide and which contains wafers 20, is mounted. With the aid of a lift 4, which is shown diagrammatically only, the cover 3 is moved, together with plug 5 and wafer rack 6, in and out of the furnace and loaded separately. However, it must be understood that constructions with which the cover is a separate part of the wafer rack can also be used.

A chamber 7 is delimited in the fixed section 2 of the furnace. A top seal 8 is provided, which essentially consists of insulating material. The side walls of the furnace likewise consist of an insulation 10 and a heating element 11 is fitted over the entire height. Two liners are located inside said heating element 11. The first liner 13 made of silicon carbide material delimits the treatment chamber 7. A second liner made of quartz material, which is indicated by 12, is arranged concentrically around said first liner.

Liner 12 is provided at the top with a nozzle 28 to which a pipe 22, preferably made of quartz material which is impermeable to radiation, is welded, a second pipe 31, which preferably is likewise made of quartz material, being welded to this pipe 22. The seal with regard to top section 8 is produced with the aid of a sealing insulation 9. The extension of tube 22 engages on a vacuum-tight stuffing box seal 21, such as an Ultra Torro® seal, the other side of which is connected to the vacuum clamp 17, which preferably is provided with a vertical flexible connection 32. Vacuum clamp 17 is provided with an inlet 19 for supplying flushing gas. Furthermore, vacuum clamp 17 is provided with an inlet 18 for process gas. This inlet is connected to the rounded end 16 of a coupling tube 15. The other end 16, which is likewise rounded, of the coupling tube 15 engages on an opening 14 made in the top of liner 13 of silicon carbide material. Coupling tube 15 can be made either of silicon carbide material or of quartz material, but quartz material is preferred because it is simpler to machine.

A gap, which is indicated by 23, is delimited between liner 12 and liner 13.

A thermocouple tube 24 is fitted in order to determine and to control the temperature in the furnace. The thermocouple tube is introduced from the bottom of the furnace via intake 25, in which a vacuum-tight stuffing box or the like is fitted so as to clamp the thermocouple tube to provide a seal. In addition, a clamp 26 is provided in the bottom section of the furnace which is relatively cool. This low temperature is partly due to the presence of plug 5.

The thermocouple tube 24 is not supported anywhere in the top section of the furnace. That is to say, because there is no connection between the thermocouple tube 24 and liner 13 no problems with such a connection can arise.

The furnace is provided at the bottom with a discharge 28, which on one side opens into gap 23 and on the other side opens into chamber 7.

During use, process gas and flushing gas are introduced through inlets 18 and 19, respectively. The amount of flushing gas supplied is approximately 60 times less, and preferably 100 times less, than the amount of process gas supplied. The flushing gas used can be hydrogen, helium, nitrogen, argon or other gases. In any event said gases prevent attack and deposits on the quartz tube 12.

It has been found that it is possible to work with a common discharge for the process gas and flushing gas. After all, the temperature at the bottom of the furnace is relatively low and a substantial proportion of the reaction gas has already been consumed.

The pump (not shown) which is connected to the discharge can be any vacuum pump known in the prior art, with or without pre-pump. It is also possible when using more than one pump to fit one of the pumps close to the furnace.

The second liner 12 is provided at its lower end with an O-ring seal 40. Because the quartz material of the tube has a relatively low coefficient of thermal conductivity, the temperature near the O-ring 40 will be low so that the service life thereof is optimized.

Figure 2:
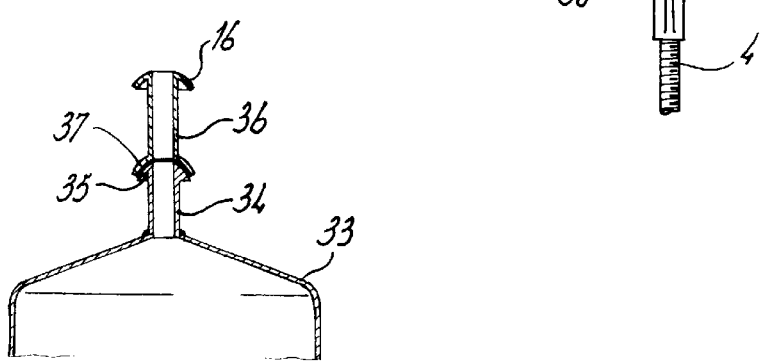
FIG. 2 shows a further embodiment of the coupling tube shown in FIG. 1.

FIG. 2 shows an alternative embodiment of the coupling tube 15 and opening 14 of first liner 13 according to FIG. 1. In this embodiment the silicon carbide liner 33 is provided with a nozzle piece 34, the top of which is provided with a spherical part 35. A dish-shaped part 37 of an attachment 36 fits into the spherical part 35, the other end of the attachment 36 being provided with a rounded end 16, as shown in FIG. 1.

It will be understood that numerous variants of such attachments are possible. As indicated above, the seal is not critical because this closes tight as the process proceeds in the hot section. In the use position at low temperature a play of a few millimetres is not uncommon. To protect the wafer rack 6 itself, the latter can be made of silicon carbide material. To protect the insulating plug 5, the latter can be provided with a protective liner of silicon carbide material 38. To protect the thermocouple tube, the latter can be provided with a protective liner of silicon carbide or quartz material 39.

Although the invention has been described above with reference to preferred embodiments, it will be understood by those skilled in the art that numerous modifications can be made thereto without going beyond the inventive concept, as given in the claims. For instance, it is possible to make use of quartz-quartz tubes instead of the SiC-quartz combination mentioned here. In such a case the innermost quartz tube will be a quartz tube of simple construction which can be replaced at low cost price. The innermost tube will not be capable of absorbing the (reduced) pressure forces produced in such a tube. The outermost quartz tube serves for this purpose.

What is claimed is:

1. A vertical furnace for the treatment of semiconductor substrates under reduced pressure, comprising a treatment chamber delimited by a first liner made of refractory material, around which a second liner made of quartz material is arranged essentially concentrically, and wherein a heating element is arranged outside the second liner, characterized in that the first liner comprises SiC and is fitted such that it is stationary, and in that the first and the second liner are provided with, respectively, a first and a second nozzle at the top, the second nozzle being arranged essentially concentrically around the first nozzle, the free end of at least one nozzle being connected to the remainder of the furnace via a seal which permits movement wherein the gap between the first and second liner can be put under reduced pressure and the second liner is sealed relative to the surroundings, said furnace including at least one discharge for placing the furnace under reduced pressure.

2. Vertical furnace according to claim 1, wherein said permitting movement comprise a vacuum-tight stuffing box seal.

3. Vertical furnace according to claims, wherein the first nozzle comprises a separate part of refractory material, which is clamped between, on one side, the top of said first liner and, on the other side, the other part of said furnace.

4. Vertical furnace according to claim 3, wherein said separate part comprises a quartz material.

5. Vertical furnace according to claim 3, wherein at least one of the connections of the separate part to either the first liner or the other part of the furnace comprises a ball-and-cup coupling.

6. Vertical furnace according to one of the preceding claims, wherein an inlet for process gas connects to the first nozzle and an inlet for flushing gas connects to the second nozzle.

7. Vertical furnace according to claim 1, a wafer rack made of silicon carbide material.

8. Vertical furnace according to claim 1, wherein an insulating plug provided with a protective sleeve containing silicon carbide fitted in the bottom of the furnace.

9. Vertical furnace according to claim 1 including a thermocouple tube which is fitted in the furnace and which extends over a substantial portion of the furnace chamber, wherein said tube is fitted in the furnace chamber from the bottom and is fixed only in the bottom section of the furnace which does not belong to the actual treatment chamber.

10. Vertical furnace according to claim 9, wherein said tube is provided with a protective sleeve containing silicon carbide.

11. A Method for treating a semiconductor substrate in a vertical furnace at a pressure lower than 2 Torr comprising a double-walled liner, said method comprising:
introducing a processed gas into a treatment chamber delimited by a first liner, and
introducing a flushing gas into the gap between the first liner and a surrounding second liner, wherein a quantity of the flushing gas metered in is at least 50 times less than a quantity of the treatment gas metered in, and wherein the furnace is provided with a discharge, which is under a reduced pressure, for said gases.

12. A method for treating a semiconductor substrate in a vertical furnace comprising:
introducing a process gas into a treatment chamber delimited by a first liner made of SiC material;
introducing a flushing gas into a gap between the first liner and a surrounding second liner made of quartz material, the first and second liners being provided with, respectively, a first and a second nozzle at the top, the second nozzle being arranged essentially concentrically around the first nozzle, the free end of at least one nozzle being connected to the remainder of the furnace by way of a seal; and
applying a reduced pressure to the chamber and to the gap, the second liner being sealed relative to the surroundings.

* * * * *

UNITED STATES PATENT AND TRADEMARK OFFICE
CERTIFICATE OF CORRECTION

PATENT NO. : 6,225,602 B1  Page 1 of 1
DATED : May 1, 2001
INVENTOR(S) : Jacobus Pieter Buijze, Jeroen Jan Stoutjesdijk, Christianus Gerardus Maria De Ridder and Hubertus Johannes Julius Stohr It is certified that error appears in the above-identified patent and that said Letters Patent is hereby corrected as shown below:

<u>Column 6,</u>
Line 1, change "said permitting" to -- said seal permitting --.
Line 4, change "according to claims" to -- according to one of the preceding claims --.
Line 17, change "claim 1, a wafer" to -- claim 1 including a wafer --.
Line 19, change "claim 1, wherein an" to -- claim 1 including an --.

Signed and Sealed this

Fifteenth Day of October, 2002

*Attest:*

JAMES E. ROGAN
*Attesting Officer*  *Director of the United States Patent and Trademark Office*